United States Patent [19]

Nishiyama et al.

[11] Patent Number: 5,151,868
[45] Date of Patent: Sep. 29, 1992

[54] SIGNAL LINE TERMINAL ALLOCATION METHOD

[75] Inventors: Yoshinori Nishiyama, Odawara; Tomoatsu Yanagita, Ebina; Masahiko Nagai, Kanagawa; Mitsuru Morikuni, Ebina; Kenji Matsumoto, Kanagawa, all of Japan

[73] Assignees: Hitachi, Ltd., Tokyo; Hitachi Computer Engineering Co., Ltd., Kanagawa, both of Japan

[21] Appl. No.: 472,816

[22] Filed: Jan. 31, 1990

[30] Foreign Application Priority Data

Feb. 6, 1989 [JP] Japan ................................. 1-025785

[51] Int. Cl.$^5$ ............................................. G06F 15/20
[52] U.S. Cl. ................................... 364/490; 364/488; 364/491
[58] Field of Search ................ 364/488, 489, 490, 491

[56] References Cited

U.S. PATENT DOCUMENTS

| 4,612,618 | 9/1986 | Pryor et al. ............ 364/488 X |
| 4,615,011 | 9/1986 | Linsker .................. 364/491 |
| 4,630,219 | 12/1986 | DiGiacomo et al. ..... 364/490 X |
| 4,688,072 | 8/1987 | Heath et al. ............ 364/491 X |
| 4,701,860 | 10/1987 | Mader .................... 364/490 |
| 4,839,821 | 6/1989 | Murakata ................ 364/488 X |
| 4,918,614 | 4/1990 | Modarres et al. ....... 364/489 X |
| 5,046,017 | 9/1991 | Yuyama et al. ......... 364/491 |
| 5,072,402 | 12/1991 | Ashtaputre et al. .... 364/490 |

Primary Examiner—Parshotam S. Lall
Assistant Examiner—Edward R. Cosimano
Attorney, Agent, or Firm—Antonelli, Terry, Stout & Kraus

[57] ABSTRACT

A signal line terminal allocation method includes an electronic device which is hierarchically designed to obtain terminal allocations which satisfy electrical restrictive conditions. The electronic device includes high hierarchial components and low hierarchial components; the high hierarchial components are connected to the low hierarchical components by a plurality of signal lines through a plurality of signal line terminals. The method including the steps of: 1) obtaining all the different combinations of an allocation of the signal lines to the signal line terminals; 2) calculating a plurality of signal line lengths for all the different combinations, each of the plurality of signal line lengths corresponding to a sum of the line lengths of each of the signal lines in the allocation; and 3) selecting the combinations of allocation of signal lines in which electrical restrictions corresponding to each of the plurality of signal lines are satisfied, the electrical restrictions including the maximum line length. The above method includes groups of plural signal lines of both high and low hierarchial components.

7 Claims, 5 Drawing Sheets

1 LATTICE = 1 cm

LA = 6 cm

LB = 7 cm

LA + LB = 13 cm

LA = 10 cm

LB = 5 cm

LA + LB = 15 cm

SIGNAL LINE TERMINAL ALLOCATION METHOD

BACKGROUND OF THE INVENTION

The present invention relates to a terminal allocation system in a printed board, an LSI and the like and more particularly to a terminal allocation system for obtaining excellent electrical characteristics of the printed board, the LSI and the like.

When the electronic device is designed hierarchically, a technique of the prior art in allocating signal lines to terminals, for example, is disclosed in the Japanese Patent Application Laid-Open Number SHO 59-197189, and is well-known. The prior art of this sort is an allocation system in which the total wiring length of the whole signal lines from lower hierarchical components through terminals is made shortest when the signal lines are allocated to terminals for the purpose of reducing the unconnected pin to pin ratio. When the operation of the electronic device is at comparatively low speed, it is not required to consider wiring length restrictive conditions on signal lines by the signal frequency, the number of loads and so on. Therefore, it was possible to conduct terminal allocation of signal lines having good electrical characteristics.

Generally, it is required to consider wiring length restrictive conditions of signal lines in order to make the electronic device operate at a higher speed.

In said prior art, however, no consideration is given to wiring length restrictive conditions of respective signal lines. Thus, said prior art has a drawback that it is not possible to conduct terminal allocation which satisfies wiring length restrictive conditions of signal lines and has good electrical characteristics when the operation of the electronic device is at high speed in a hierarchically designed electronic device.

The above said problems will be described in a more concrete manner with reference to FIG. 7. In FIG. 7, it is assumed that signal points A1 and B1 of hatched components and signal points A2 and B2 of components in an upper hierarchy of those components are connected with each other by means of signal lines A and B; two terminals $T_1$ and $T_2$ are designated as terminals for connection between both hierarchies, and wiring lengths of the signal lines A and B are restricted to LA max=10 cm and LB max=5 cm, respectively.

When the signal line A is allocated to the terminal $T_1$ and the signal line B is allocated to the terminal $T_2$, the wiring length of the whole signal lines becomes LA+LB=13 cm as shown in the case 1 in FIG. 7. Also, when the signal line A is allocated to the terminal $T_2$ and the signal line B is allocated to the terminal $T_1$, the wiring length of the whole signal lines becomes LA+LB=15 cm as shown in the case 2 in FIG. 7. Since the total wiring length in the case 1 is shorter, the wiring of the case 1 is selected in the abovementioned prior art. However, the wiring length LB of the signal line B becomes longer than LB max, thus good electrical characteristics are not obtainable.

SUMMARY OF THE INVENTION

It is an object of the present invention to provide a terminal allocation system which can provide good electrical characteristics that can not be realized by only making the total wiring length of the whole signal lines shortest by solving the above-mentioned problems of the prior art and taking wiring length restrictive conditions that are electrical restrictions of respective signal lines, that is, selecting those terminals that satisfy electrical restrictive conditions.

According to the present invention, the above-described object can be achieved in terminal allocation of signal lines by finding wiring lengths of signal lines obtained by allocating the signal lines to the terminals with respect to all of the combinations of allocatable terminals, selecting an allocatable combination which satisfy electrical restrictive conditions out of all of the obtained combinations of terminal allocation of the signal lines, and allocating the signal lines to the allocatable terminals.

Further, when respective signal lines are divided into groups according to electrical characteristics thereof and wiring length restrictive conditions of respective groups are obtained from the electrical restrictive conditions, the above-described object can be achieved by finding wiring lengths of the signal lines obtained by allocating the signal lines to the terminals with respect to all the combinations of allocatable terminals, selecting an allocatable combination that satisfy the wiring length restrictive conditions of the groups to which respective signal lines belong out of all the obtained combinations of terminal allocation of the signal lines, and allocating the signal lines to the allocatable terminals.

Furthermore, the above-described object can be achieved in terminal allocation of the signal lines by finding wiring lengths of the signal lines obtained by allocating the signal lines to the terminals with respect to all the combinations of allocatable terminals, selecting a combination having the shortest total wiring length of the whole signal lines when there are a plurality of allocatable combinations which satisfy electrical restrictive conditions out of all the obtained combinations of terminal allocation of the signal lines, and allocating the signal lines to the allocatable terminals.

DESCRIPTION OF THE PREFERRED EMBODIMENTS

An embodiment of the present invention will be described in detail hereafter with reference to the drawings.

Figure 1:
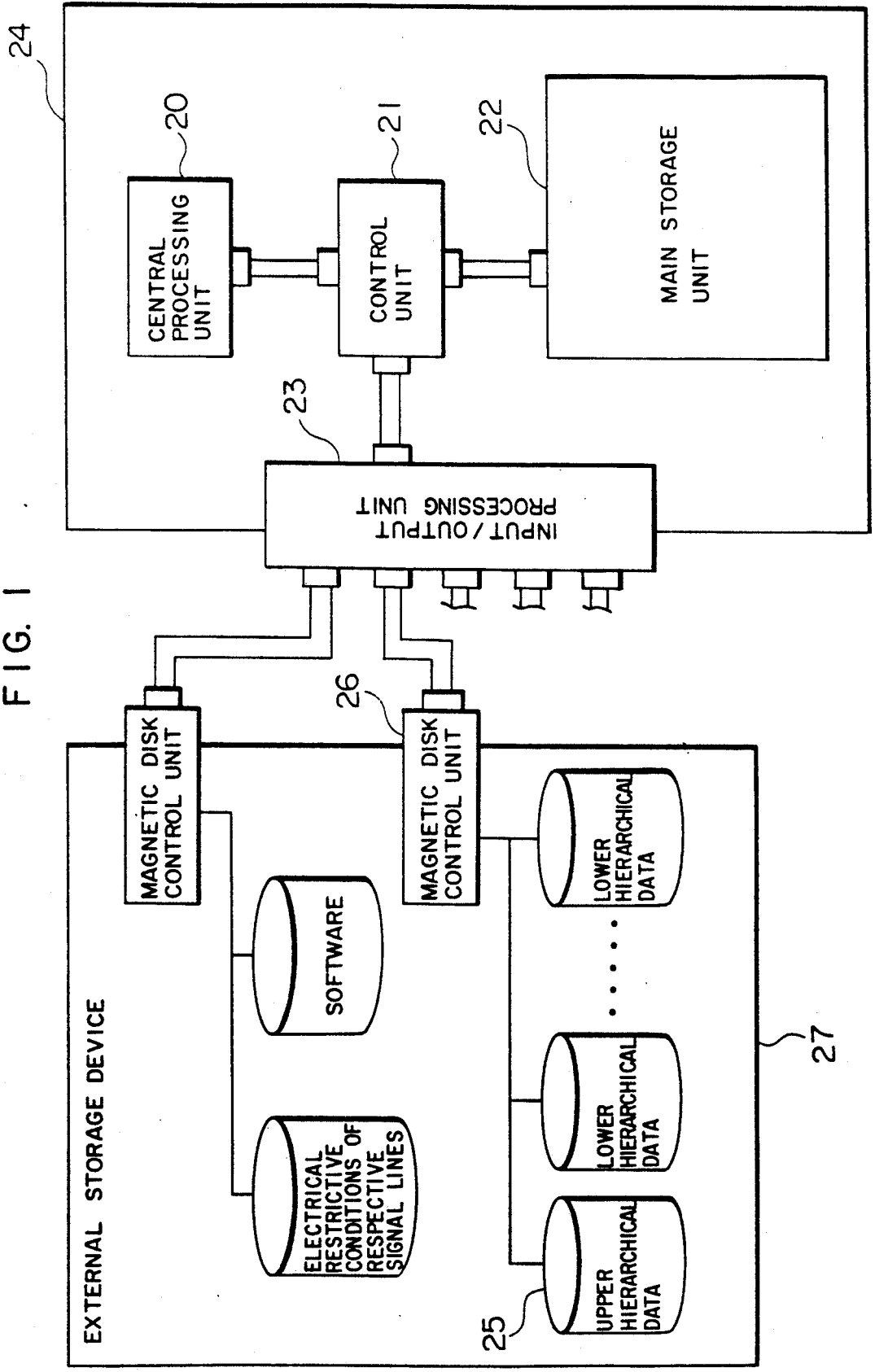
FIG. 1 is a block diagram showing an embodiment of a system composition when the system of the present invention is executed by means of a software.

An embodiment of a system which executes the system of the present invention is composed of a computer proper 24 and an external storage device 27 as shown in FIG. 1. Further, the computer proper 24 is composed of a central processing unit 20 which executes the software, a main storage unit 22 which stores the software to be executed, data for performing input/output and so forth, an input/output processing unit 23 which performs input/output of the software and the data, and a control unit 21 for controlling these units. The external storage device 27 is composed of a magnetic disk unit 25 which loads the software and the data and a magnetic disk control unit 26 which controls this magnetic disk unit 25.

The system of the present invention can be realized by that, in the system shown in FIG. 1, the hierarchical structure of the electronic device, signal line information showing the connection states of respective terminals, electrical restrictive conditions of respective signal lines, the software for realizing the present invention and so forth are loaded in the external storage device 27, that the software and various data loaded in the external storage device 27 are input to the computer proper 24 by the direction of an operator, and that the software is executed in the computer proper 24.

Figure 2:
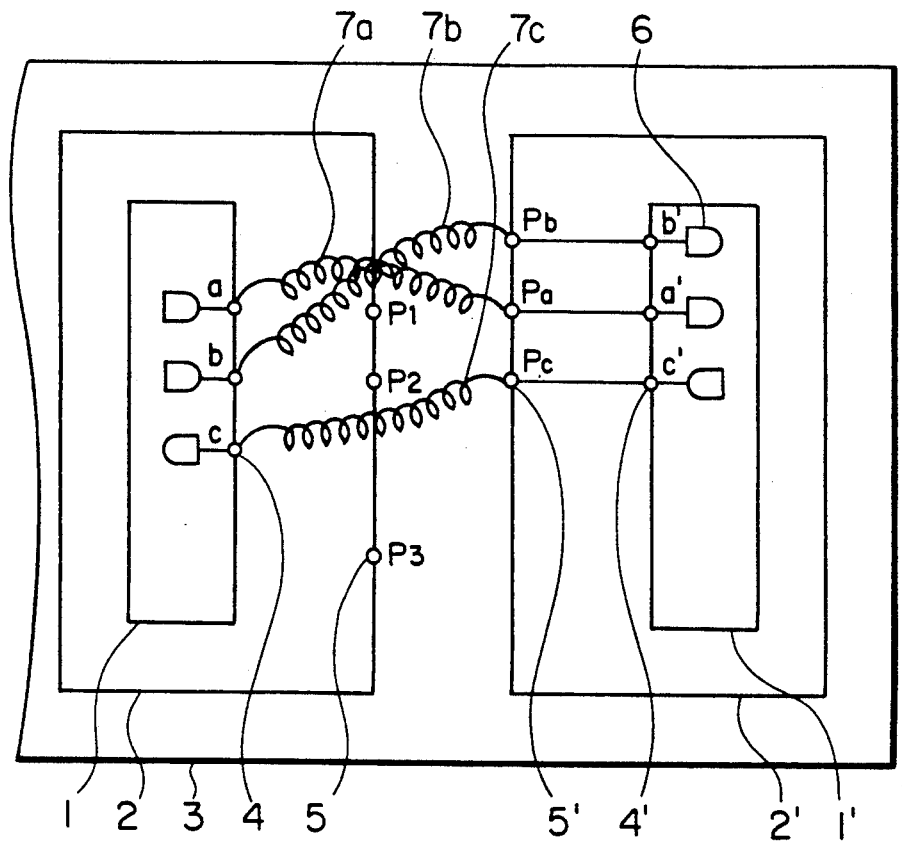
FIG. 2 is a diagram for explaining an example of signal line allocation in an electronic device designed in three hierarchies.

FIG. 2 shows an example of signal line terminal allocation in an electronic device designed in three hierarchies. It is assumed that the electronic device is composed of three hierarchies in total, viz., LSIs 1 and 1' packaged with a logical gate 6 having a logical function such as AND and OR, printed boards 2 and 2' packaged with these LSIs 1 and 1' and a mother board 3 packaged with these printed boards 2 and 2'. Terminal allocation of LSI terminals 4 and 4' and printed board terminal 5' of the printed board 2' has been executed, and the printed board terminals 5 of the printed board 2 which signal lines 7a, 7b and 7c can use terminals $P_1$, $P_2$ and $P_3$. Further, it is assumed that the electrical restrictive condition of a signal line 7a which connects between a terminal a of the LSI 1 and a terminal Pa of the printed board 2' is 4 cm or less, the electrical restrictive condition of a signal line 7b is similarly 10 cm or less, and the electrical restrictive condition of a signal line 7c is 5 cm or less.

A case in which the signal lines 7a, 7b and 7c are allocated to the usable terminals $P_1$, $P_2$ and $P_3$ of the printed board terminals 5 in ar electronic device under such conditions as described above will be explained.

First, cases of all the combinations in which the signal lines 7a, 7b and 7c can be allocated to the allocatable terminals $P_1$, $P_2$ and $P_3$ are obtained as follows:

Case 1

The signal line 7a, the signal line 7b and the signal line 7c are allocated to the terminals $P_1$, $P_2$ and $P_3$, respectively.

Case 2

The signal line 7a, the signal line 7b and the signal line 7c are allocated to the terminals $P_1$, $P_3$ and $P_2$, respectively.

Case 3

The signal line 7a, the signal line 7b and the signal line 7c are allocated to the terminals $P_2$, $P_1$ and $P_3$, respectively.

Case 4

The signal line 7a, the signal line 7b and the signal line 7c are allocated to the terminals $P_2$, $P_3$ and $P_1$, respectively.

Case 5

The signal line 7a, the signal line 7b and the signal line 7c are allocated to the terminals $P_3$, $P_1$ and $P_2$, respectively.

Case 6

The signal line 7a, the signal line 7b and the signal line 7c are allocated to the terminals $P_3$, $P_2$ and $P_1$, respectively.

Figure 3:
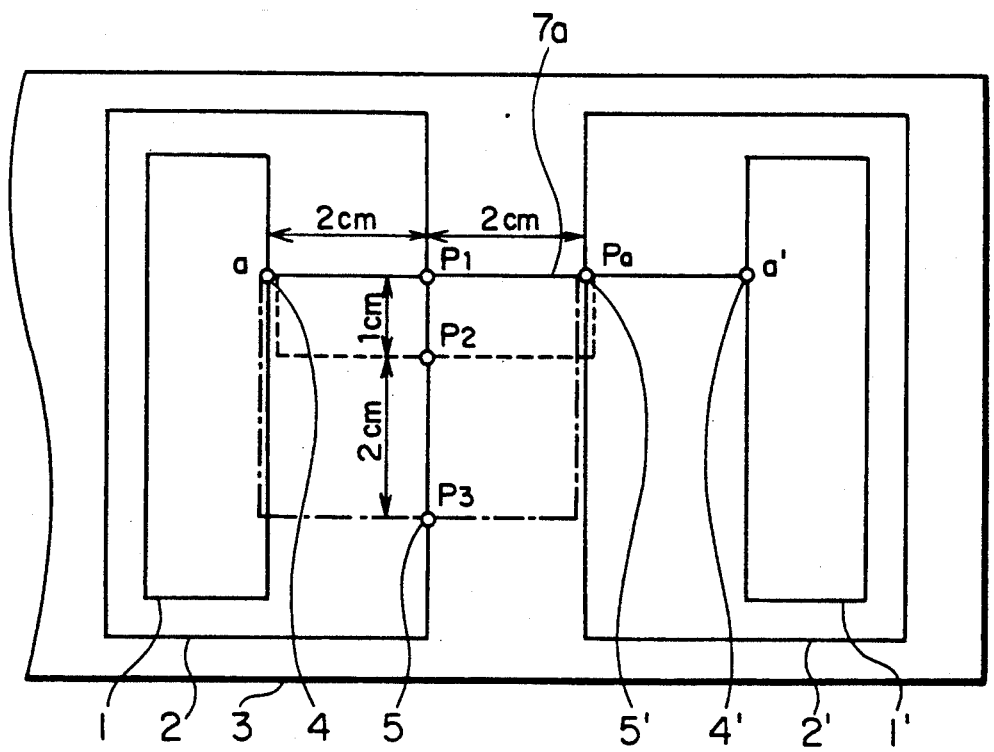
FIG. 3 to FIG. 5 are diagrams for explaining the detail of terminal allocation processing of a printed board in an electronic device designed in three hierarchies.
Figure 4:
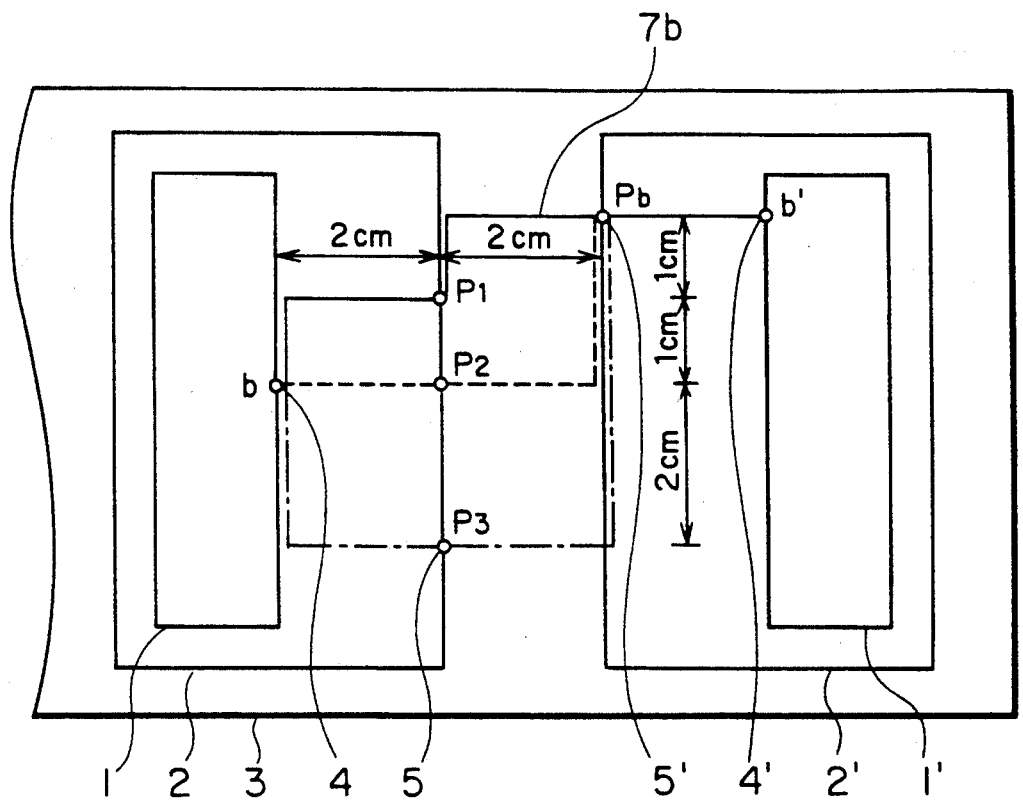
Figure 5:
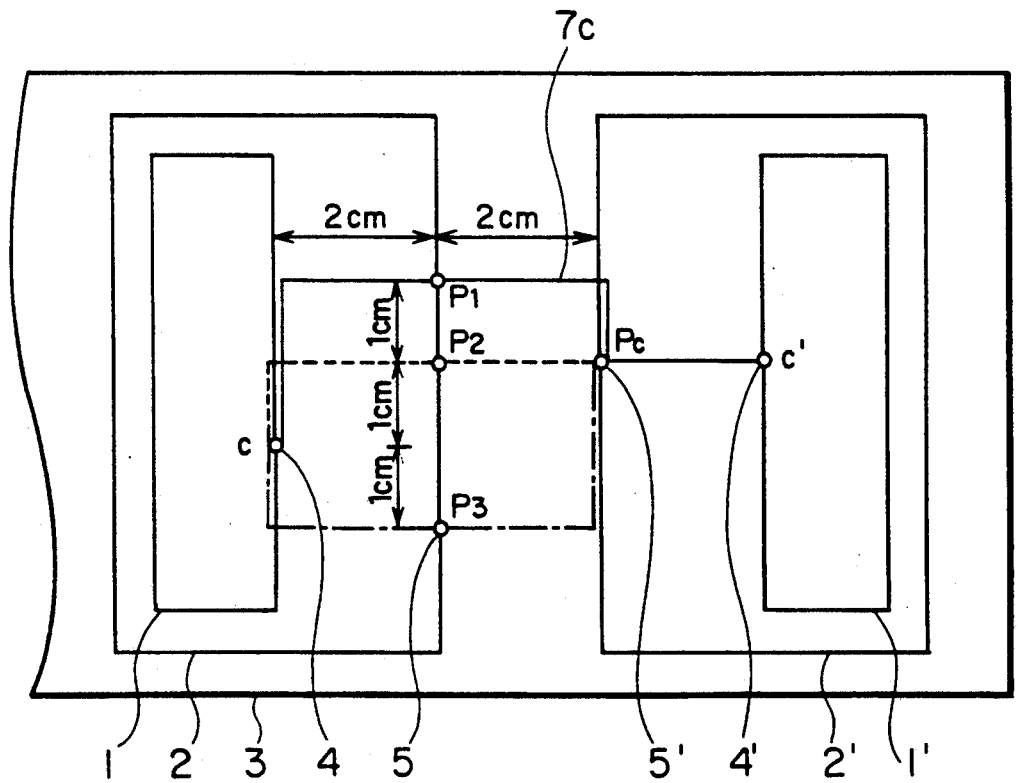

FIG. 3 shows the signal line route when the signal line 7a is allocated to the terminals $P_1$, $P_2$ and $P_3$. The Manhattan length which is the wiring length when the signal line 7a is allocated to the terminal $P_1$ is 4 cm, and the wiring lengths when the signal line 7a is allocated to the terminals $P_2$ and $P_3$ are 6 cm and 10 cm, respectively. FIG. 4 and FIG. 5 show the signal line routes when the signal lines 7b and 7c are allocated to the terminals $P_1$, $P_2$ and $P_3$, respectively. The following effects are obtained when the wiring length is obtained in a similar manner as the signal line 7a.

| (Wiring length of the signal line 7a) | |
|---|---|
| when allocated to the terminal $P_1$: | 4 cm |
| when allocated to the terminal $P_2$: | 6 cm |
| when allocated to the terminal $P_3$: | 10 cm |
| (Wiring length of the signal line 7b) | |
| when allocated to the terminal $P_1$: | 6 cm |
| when allocated to the terminal $P_2$: | 6 cm |
| when allocated to the terminal $P_3$: | 10 cm |
| (Wiring length of the signal line 7c) | |
| when allocated to the terminal $P_1$: | 7 cm |
| when allocated to the terminal $P_2$: | 5 cm |
| when allocated to the terminal $P_3$: | 7 cm |

Lastly, it is verified with the case 1 through the case 6 whether the wiring lengths satify the electrical restrictive conditions of the signal lines 7a, 7b and 7c when the signal lines 7a, 7b and 7c are allocated to respective terminals. That is, in the case 1, the electrical restrictive condition of the signal line 7c has to be 5 cm or less, but the wiring length becomes 7 cm when the signal line 7c is allocated to the terminal $P_3$, which is in contravention of the electrical restrictive condition. In the case 2, respective wiring lengths satisfy respective electrical restrictive conditions of the signal lines 7a, 7b and 7c. In the cases 3, 4 and 6, the signal lines 7a and 7c are in contravention of the electrical restrictive conditions. In the case 5, the signal line 7a is in contravention of the electrical restrictive condition. Accordingly, it is only the case 2 that satisfies the electrical restrictive conditions of the signal lines 7a, 7b and 7c. Thus, the signal line terminal allocation which may obtain good electrical characteristics is terminated by allocating the signal line 7a to the terminal $P_1$, the signal line 7b to the terminal $P_3$ and the signal line 7c to the terminal $P_2$.

The example of signal line terminal allocation shown in FIG. 2 has been described above, but the model is simplified in this example for the purpose of making it easy to understand the wiring length of the signal line. That is, one piece of LSI is connected on the same printed board for one signal line in the example shown in FIG. 2, however, wiring and connection are made generally in a serial manner (or in accordance with a given rule) among a plurality of LSIs on the same printed board. Further, the wiring length restrictive conditions are prescribed in general between both ends of the wired signal line (between the source LSI terminal and the last load LSI terminal). Furthermore, a difference is produced in the restrictive conditions depending on the difference in the characteristic impedance of the wiring route on the substrate (printed board, mother board) which is employed.

Figure 8:
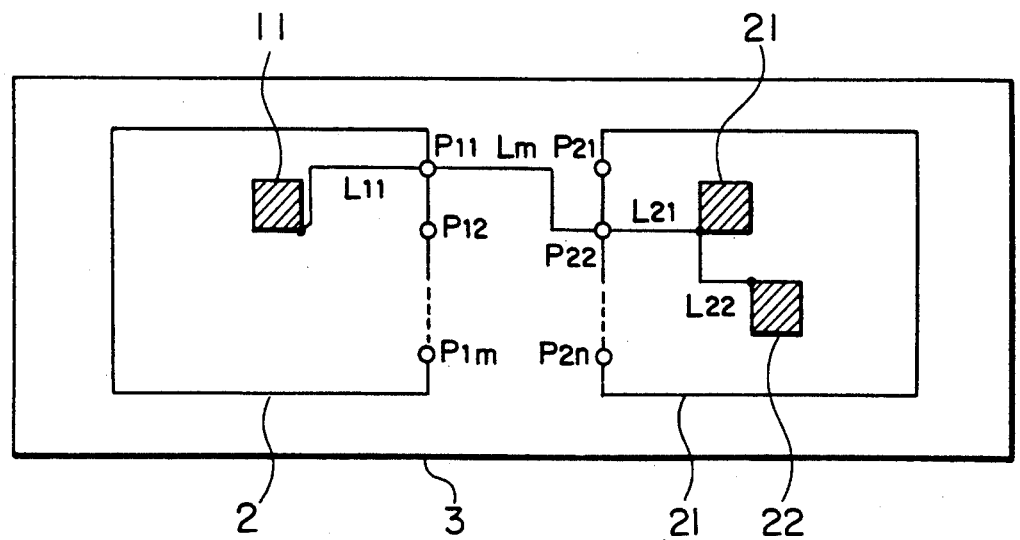
FIG. 8 shows a model of a general signal line.

FIG. 8 shows a general model of a signal line. In FIG. 8, 2 and 2' denote printed boards which mount LSIs, 3 denotes a mother board which mounts a printed board, 11, 21 and 22 denote LSIs, and $P_{11}$ to $P_{1m}$ and $P_{21}$ to $P_{2n}$ denote input/output terminals of the printed boards 2 and 2', respectively. When it is assumed that the wiring length of the signal line on the printed board is $L_{11}$, the wiring length between the input/output terminal on the printed board and the first LSI is $L_{21}$, the wiring length between the first LSI and the second LSI is $L_{22}$, and the wiring length on the mother board is $L_m$, the wiring length restrictive conditions are shown with an expression (1), as follows:

$$L_{11} 30 L_{21} + L_{22}\alpha \cdot L_m < L_G \quad (1)$$

Here, $\alpha$ is the ratio of characteristic impedances of the wiring routes on the printed board and the mother board, and $L_G$ is an allowable maximum wiring length of a group to which the signal line belongs.

Accordingly, when it is desired to obtain the shortest total wiring length on the substrate including the printed board and the mother board while keeping to the wiring length restrictive conditions, it is only required to obtain the combination of input/output terminals which makes the value of the following expression (2) minimal while keeping to the expression (1).

$$L_{11} + L_{21} + L_{22} \quad (2)$$

Also, when it is desired to make the signal delay time on the substrate the shortest, it is only required to obtain the combination of input/output terminals which makes the value of the following expression (3) minimal while keeping to the expression (1).

$$L_{11} + L_{21} + L_{22} + \beta \cdot L_m \quad (3)$$

Here, $\beta$ is the ratio of the signal delay time per unit length on the printed board and the mother board.

Besides, when the number of LSIs to be connected on the printed board is increased further, it is easy to cope with the situation by expanding the expressions (1), (2) and (3).

Figure 6:
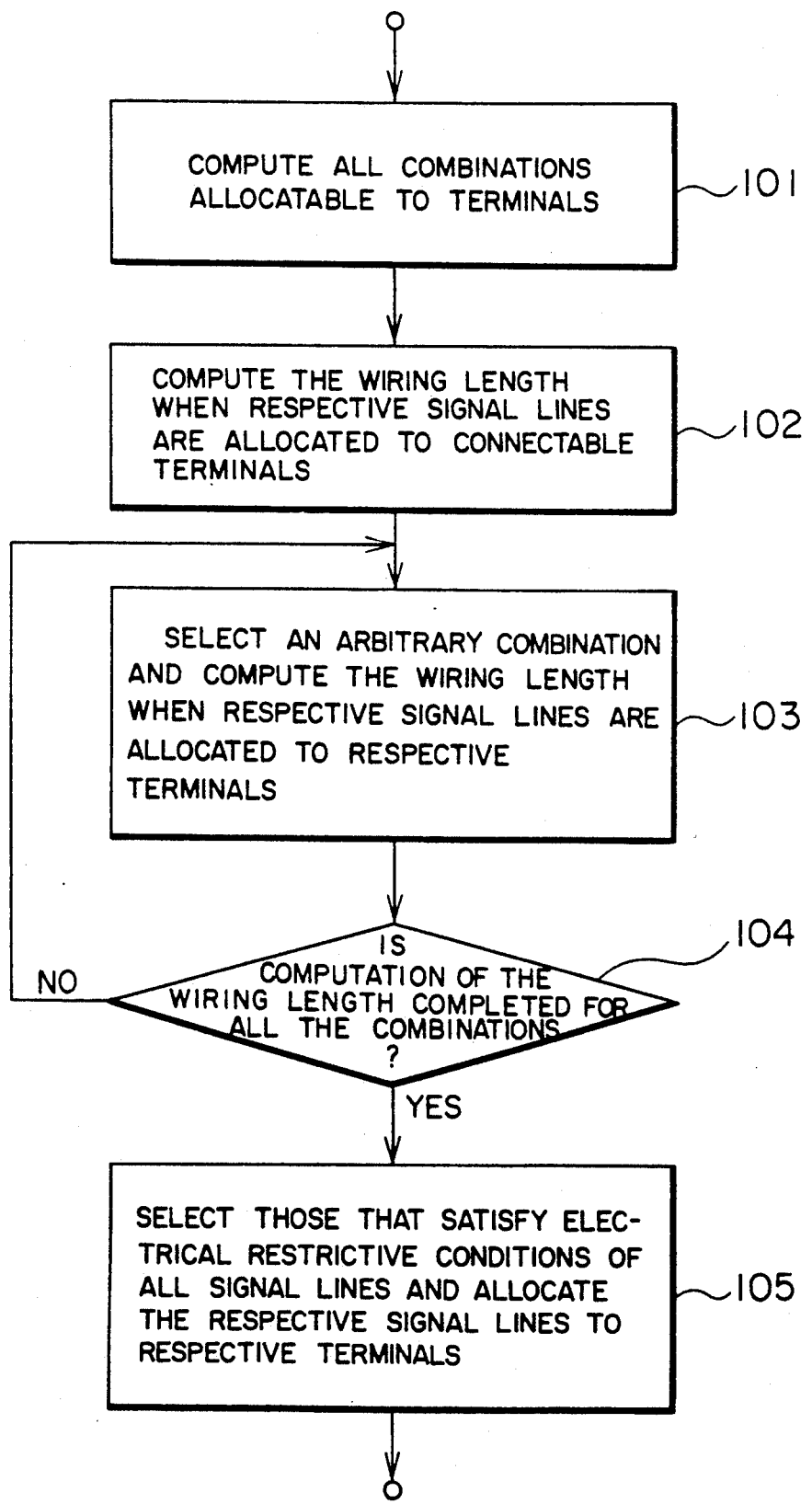
FIG. 6 is a flow chart for explaining processing operation of an embodiment of the present invention.
Figure 7:
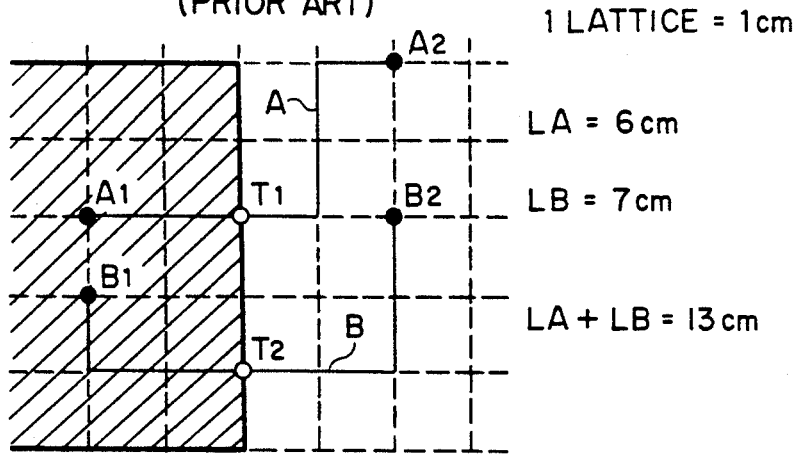
FIG. 7 is an view for explaining a prior art.
Figure 7:
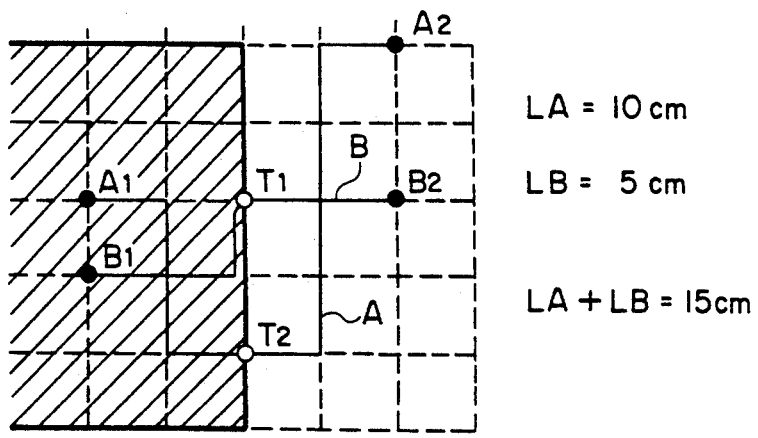

In the next place, the above-described terminal allocating operation will be explained with a process flow shown in FIG. 6.

(1) All the combinations in which the signal lines can be allocated to designated connectable terminals are computed (process 101).

(2) Next, the wiring length when respective signal lines are allocated to designated connectable terminals is computed (process 102).

(3) One optional combination is selected out of all the combinations obtained in the process 101, and the wiring length when respective signal lines are allocated to respective terminals is computed in accordance with the wiring length obtained in the process 102 (process 103).

(4) For all the combinations obtained in the process 101, the processing is returned to the process 103 when the process 103 has not been completed, and the processing is moved to the process 105 when the process 103 is completed for all the combinations (process 104).

(5) The wiring lengths and the electrical restrictive conditions of respective signal lines are compared with each other for all the combinations. Then, those that satisfy the electrical restrictive conditions of all the signal lines are selected and respective signal lines are allocated to respective terminals, thereby to complete the processing (process 105).

While the present invention has been described above concretely with reference to an embodiment. However, it will be appreciated that the present invention is not limited thereto, but various modifications should be considered to be within the scope which does not deviate from the gist of the present invention.

As described above, according to the present invention, by selecting those terminals that satisfy the electrical restrictive conditions of respective signal lines in terminal allocation of the signal lines which pass the hierarchies of an electronic device which is designed hierarchically, it is possible to obtain good electrical characteristics and to largely reduce the manhours of signal line terminal line allocation work of an electronic device which is designed hierarchically. Furthermore, the present invention is applicable to any hierarchical structure only by computing the wiring lengths of the signal lines and giving consideration to electrical restrictive values of the signal lines, thus providing such an effect that wide application scope may be expected.

We claim:

1. A signal line terminal allocation method executed by a computer for an electronic device which is hierarchically designed, said electronic device comprising high hierarchial components and low hierarchial components, the high hierarchial components being connected to the low hierarchial components by a plurality of signal lines through a plurality of signal line terminals, the method comprising the steps of:

obtaining all of the different plural combinations of an allocation of the plurality of signal lines to the plurality of signal line terminals;

calculating a plurality of the signal line lengths for all of the different plural combinations, each of the plurality of the signal line lengths corresponding to a sum of line lengths of each of the plurality of signal lines in the allocation;

selecting plural combinations of the allocation of the plurality of signal lines in which electrical restrictions corresponding to said each of the plurality of signal liens are satisfied, the electrical restrictions comprising an allowable maximum line length of said each of the plurality of signal lines; and allocating said each of the plurality of signal lines to the plurality of signal line terminals in accordance with one combination from the plural combinations which satisfies said electrical restrictions.

2. The method as in claim 1, wherein said allowable maximum line length is defined by a characteristic impedance of a wiring route of the plurality of signal lines.

3. The method as in claim 1, wherein the step of selecting further includes the step of only selecting the combination having the shortest length.

4. A signal line terminal allocation method executed by a computer for an electronic device which is hierarchically designed, said electronic device comprising high hierarchial components and low hierarchial components, both the high hierarchial components and the low hierarchial components comprising plural signal lines, the plural signal lines connecting the high hierarchial components with the low hierarchical components through plural signal line terminals, the method comprising the steps of:

forming plural groups of signal lines from the plural signal liens, each of the plural groups of signal lines corresponding to a signal line terminal of the plural signal line terminals;

obtaining all of the different plural combinations of an allocation of the plural groups of signal lines to the plural signal line terminals;

calculating a plurality of group line lengths for all of the different plural combinations, each of the plurality of the group line lengths corresponding to a sum of line lengths of each of the plural groups of signal liens in the allocation, a line length of each of the plural groups corresponding to a sum of line lengths of each of the plural signal lines of each of the plural groups; and selecting combinations of the allocation of the plural groups of the plural signal lines in which electrical restrictions corresponding to each of the plural groups of the plural signal lines are satisfied, the electrical restrictions comprising an allowable maximum line length of each of the plural signal lines; and allocating each of plural groups of plural signal lines to the plural signal line terminals in accordance with one combination from said combinations which satisfies said electrical restrictions.

5. The method as in claim 4, wherein the step of selecting further includes the step of only selecting the combination of said combinations having the shortest length.

6. The method as in claim 4, wherein the electrical restrictions correspond to conditions of the plural signal lines of each of the groups.

7. The method as in claim 4, wherein said allowable maximum line length is defined as signal delay times.

* * * * *